(12) United States Patent
Klootwijk et al.

(10) Patent No.: US 8,395,914 B2
(45) Date of Patent: Mar. 12, 2013

(54) DC-TO-DC CONVERTER COMPRISING A RECONFIGURABLE CAPACITOR UNIT

(75) Inventors: Johan H. Klootwijk, Eindhoven (NL); Hendrik J. Bergveld, Eindhoven (NL); Freddy Roozeboom, Waalre (NL); Derk Reefman, Best (NL); Jaap Ruigrok, Aste (NL)

(73) Assignee: NXP B.V., Eindhoven (NL)

( * ) Notice: Subject to any disclaimer, the term of this patent is extended or adjusted under 35 U.S.C. 154(b) by 627 days.

(21) Appl. No.: 12/597,308

(22) PCT Filed: May 8, 2008

(86) PCT No.: PCT/IB2008/051823
§ 371 (c)(1),
(2), (4) Date: Oct. 23, 2009

(87) PCT Pub. No.: WO2008/139392
PCT Pub. Date: Nov. 20, 2008

(65) Prior Publication Data
US 2010/0117612 A1 May 13, 2010

(30) Foreign Application Priority Data
May 10, 2007 (EP) ..................................... 07107975

(51) Int. Cl.
*H02M 3/07* (2006.01)
(52) U.S. Cl. ............................ 363/60; 363/62; 363/147
(58) Field of Classification Search .................... 363/59, 363/60, 61, 62, 147
See application file for complete search history.

(56) References Cited

U.S. PATENT DOCUMENTS

| 4,513,364 | A | 4/1985 | Nilssen |
| 5,444,310 | A | 8/1995 | Kataoka et al. |
| 6,198,645 | B1 | 3/2001 | Kotowski et al. |
| 6,281,705 | B1* | 8/2001 | Yu .................................. 326/68 |
| 6,897,508 | B2 | 5/2005 | Sneh |
| 2003/0213989 | A1 | 11/2003 | Delpech et al. |
| 2004/0222775 | A1 | 11/2004 | Muramatsu |
| 2004/0228067 | A1 | 11/2004 | Gutsche et al. |
| 2005/0213267 | A1 | 9/2005 | Azari et al. |
| 2010/0117612 | A1* | 5/2010 | Klootwijk et al. ............ 323/282 |

FOREIGN PATENT DOCUMENTS

| DE | 10358299 A1 | 7/2005 |
| EP | 0513920 | 11/1992 |
| JP | 2002062858 A | 2/2002 |
| WO | 2004/114397 | 12/2004 |
| WO | 2007054858 A2 | 5/2007 |
| WO | 2007132423 A2 | 11/2007 |

* cited by examiner

Primary Examiner — Jeffrey Sterrett

(57) ABSTRACT

The present invention relates to a configurable trench multi-capacitor device comprising a trench in a semiconductor substrate. The trench has a lateral extension exceeding 10 micrometer and a trench filling includes a number of at least four electrically conductive capacitor-electrode layers. A switching unit is provided that comprises a plurality of switching elements electrically interconnected between different capacitor-electrode layers of the trench filling. A control unit is connected with the switching unit and configured to generate and provide to the switching unit respective control signals for forming a respective one of a plurality of multi-capacitor configurations using the capacitor-electrode layers of the trench filling.

17 Claims, 9 Drawing Sheets

DC-TO-DC CONVERTER COMPRISING A RECONFIGURABLE CAPACITOR UNIT

FIELD OF THE INVENTION

The present invention relates to a DCDC converter

The disclosure of EP05110488.3, PCT/IB/2006/054063 (PH001923EP1), and of EP06113955.6 (PH005924EP1) is enclosed by reference in its entirety in the present application.

BACKGROUND OF THE INVENTION

It is well known that the a voltage ratio between an input voltage and an output voltage in a (capacitive) DC-to-DC converter is dependent on the capacitance of the converter.

It is further well known that the capacitance of a capacitor device scales with the area of the capacitor electrodes, with the dielectric constant of the dielectric material between the capacitor electrodes, and with the inverse of the distance between the capacitor electrodes.

To increase the area of the capacitor electrodes comprised in electronic devices, which are formed by integrated circuits on a semiconductor chip, trench capacitors have widely been used. In a trench capacitor, the electrodes are formed by electrically conductive layers deposited in a trench, recess or pore prepared in the substrate (wafer). A pore or trench can for instance be made by locally etching the substrate. The production of dense arrays of such features is well known. Electrode layers can be formed in the pores by known deposition techniques, such as low-pressure chemical vapor deposition (LPCVD) or atomic layer deposition (ALD). The electrically conductive layers are electrically isolated from each other and from the substrate by interposed dielectric layers.

A pore filled in this way to form a trench capacitor typically has a general shape resembling the letter "U" in a cross-sectional view. It is known to arrange a large number of pores in a substrate, in the form of a pore array, and to deposit step-conformal, that is, uniformly thick electrode layers in all pores in an attempt to achieve high capacitance values in electronic devices containing trench capacitors. A capacitance density, defined as a capacitance per unit area, is used to characterize such trench capacitor devices. Capacitance density values of about 30 $nF/mm^2$ with a breakdown voltage of 30 V can be achieved using MOS (Metal-Oxide-Semiconductor)/MIS (Metal-Insulator-Metal) capacitor layer stacks grown in pore arrays etched in a high-surface area silicon substrate, see WO2004/114397.

Double and triple-layer-stack trench capacitors are known from DRAM (dynamic random access memory) applications, see US2004/0228067 and U.S. Pat. No. 6,897,508 B2, respectively. However, the trench capacitor structures described in these documents are designed for operation at low voltages, typically in the range of a few Volts. In addition, trench capacitors in DRAM applications require a refresh of the stored charge amount several times per second, which is not acceptable in applications involving higher voltages in the range of tens of Volt, or higher-frequency signals, like radio-frequency (RF) signals. DRAM memory devices further have trench capacitors that are optimised for a small, i.e., deep submicrometer pitch between adjacent pores in the substrate.

US 2003/0213989 A1 describes a trench capacitor device, which, in a cross-sectional view has two rectangular-shaped trench capacitors with a filling in the form of a metal-poly-silicon-dielectric-polysilicon layer sequence. According to this document, high capacitance density values between 30 and 100 $nF/mm^2$ can be achieved with this structure, when using dielectric layers made from the high-k dielectric material $Ta_2O_5$. The electrodes of the trench capacitor of US 2003/0213989 are independent from the potential of the substrate.

Use of this type of capacitor for different application purposes having different capacitive requirements, that may even vary in time during operation, is not possible.

SUMMARY OF THE INVENTION

According to the invention, a DC-to-DC converter is provided, which comprises a reconfigurable capacitor unit provided with a substrate and comprising a plurality of capacitive structures each comprising a first and a second electrically conductive capacitor-electrode layer and an intermediate dielectric layer; a switching unit that comprises a plurality of switching elements electrically interconnected between different capacitive structures, wherein the individual switching elements are configured to electrically connect, in a first switching state, two (or more) respective capacitor-electrode layers with each other, and to electrically disconnect, in a second switching state, the same two (or more) respective capacitor-electrode layers from each other, the switching elements having a control input terminal and being configured to assume either the first or the second switching state in dependence on a switch-control signal applied to the control input terminal; and a control unit, which is connected with the switching unit and which is configured to generate and provide to the switching unit respective control signals for forming a respective one of a plurality of multi-capacitor configurations using the capacitive structures.

The DC-DC converter of the invention uses a plurality of capacitive structures on or in a single substrate. Furthermore, it has a switching unit and a control unit. This allows to change the voltage ratio of the converter during use. This is considered very important in view thereof that an input voltage is often a battery voltage. This battery voltage depends on the extent to which the battery is filled. Evidently, the input voltage may alternatively be a voltage from a power supply network. Also this voltage is not always the same, which is for instance due to regional differences. In a further embodiment, the input voltage is derived from another load, and thus not constant. By enabling reconfiguration of the DC-DC converter during use, the same output voltage can be maintained even though the input voltage is not constant. It will be understood that this variability opens up a wide field for reusing and optimizing the use of power that is available within and around electronic systems.

It is one of the benefits of the invention that the capacitive structures have a common substrate. As a consequence, the interconnection between the capacitive structures can be very low-ohmic. This low-ohmic value is due to both a short distance between the structures (i.e. the capacitor-electrode layers) and the provision of interconnects in a single technology. The term short should be considered here relatively to package interconnects between individual chips, including wirebonds, leads, bond pads etc. The low-ohmic value is needed, as otherwise the interconnects would lead to losses that would take away the benefit of the reconfigurability.

A particularly suitable form of a capacitive structure is a trench capacitor. This is an optimal embodiment for such capacitive structure, as its surface area is small as compared to conventional planar metal-insulator-metal capacitors. Moreover, which is even more important, the trench capacitors have very low values for the ESR and the ESL. Particularly suitable in this connection is the use of conventional dielectric layers, such as silicon nitride, silicon oxide and silicon oxynitride, as opposed to polymeric dielectric layers and ferroelectric layers. Ferroelectric layers show hysteresis behaviour, for which reason they have a higher ESR and are less suitable for the present application. Polymeric dielectric layers generally have a lower capacitance density and have a higher ESR.

A most suitable embodiment of a trench capacitor is a structure having a plurality of capacitor-electrode layers. This allows that more than one capacitive structure may be defined in a single trench. It will be understood that such an embodiment strongly reduces the losses due to interconnects. When in the following the term 'trench multi-capacitor device of the invention' is used, reference is made to such a structure. Applicant maintains its right to obtain separate patent protection for this structure.

It is observed for clarity that the non-prepublished application PCT/IB2006/54063 (PH001923) describes a DC-DC converter with capacitors that have a floating electrode. This floating electrode allows the provision of a different voltage ratios. However this prior application does not describe that the voltage ratio of the DC-DC converter may be amended during use of the capacitor. It does therefore not describe the presence of a control unit either. In other words, it is basically limited to the provision of capacitors made in a single technology that can be tuned and used for the provision of different capacitances.

The trench multi-capacitor device of the invention forms a highly flexible capacitive device integrated into a semiconductor substrate. Even with a single-trench multi-capacitor structure, the trench multi-capacitor device of the invention forms a platform for a large number of multi-capacitor configurations in a wealth of applications.

The trench multi-capacitor device of the invention enables realizing different multi-capacitor configurations by switching respective connections between different capacitor-electrode layers according to the respective desired multi-capacitor configuration. A multi-capacitor configuration of the trench multi-capacitor device shall be understood as a connection of capacitor-electrode layers of the trench filling, which connection comprises at least two capacitors. The connection of capacitor-electrode layers can for instance form an electrical series connection of capacitors, or an electrical parallel connection of capacitors, or any possible combination of a series and a parallel connection of capacitors, which can be realized with the given numbers of electrically conductive capacitor-electrode layers and dielectric layers in the trench filling. The multi-capacitor configuration may also contain a switchable or fixed connection of at least one of the capacitor-electrode layers of the trench filling to the semiconductor substrate. A configuration setting or configuration change is effected by the switching unit and the control unit.

In the trench multi-capacitor device of the invention, the capacitor-electrode layers the different capacitor-electrode layers are electrically isolated from each other within the trench. Under application of a voltage between neighboring capacitor-electrode layers a direct transport of charge carriers between the neighboring capacitor-electrode layers is avoided by the dielectric layers within the trench. However, capacitor-electrode layers can be conductively connected via the switching elements outside the trench.

In comparison with SMD (surface-mounted device) techniques, the trench multi-capacitor device of the invention reduces the device size and the cost of processing by integrating the multi-capacitor structure in a trench provided in the semiconductor substrate. The unusually large lateral extension of the trench in comparison with known fabrication technologies for trench capacitors on the basis of semiconductor technology allows fabricating a trench filling that includes a number four or more electrically conductive capacitor-electrode layers in an alternating arrangement with dielectric layers with a high capacitance density. The trench multi-capacitor device makes discrete or surface-mounted capacitors oblivious for many applications, such as DC-to-DC converters or other circuits that can make use of tuneable capacitance values or reconfigurable multi-capacitor configurations.

In the following, embodiments of the trench multi-capacitor device of the invention will be described. Unless stated otherwise explicitly, further embodiments result from a combination of the embodiments described herein.

In one embodiment, the trench in the semiconductor substrate has a lateral trench extension exceeding 10 micrometer and a trench filling that includes a number of at least four electrically conductive capacitor-electrode layers in an alternating arrangement with dielectric layers, such that the different capacitor-electrode layers of the trench filling are electrically isolated from each other. An advantage of the particularly large trench structure is the possibility to use standard, well-controlled deposition techniques such as low-pressure chemical vapor deposition (LPCVD) for fabricating the alternating sequence of electrically conductive capacitor-electrode layers and dielectric layers in the trench capacitor. This makes the trench multi-capacitor device cost-effective in comparison with known trench capacitor structures, such as those disclosed in U.S. Pat. No. 6,897,508B2. Smaller lateral trench extensions of about 1 micrometer, as disclosed in that earlier document, have very stringent boundary conditions for material choice and the number of layers of the trench filling, as well as for the layer thickness of the layers of the trench filling. Such structures rely on more elaborate and therefore cost-intensive fabrication techniques such as atomic layer deposition (ALD). The trench multi-capacitor device is free of such boundary conditions, and turns to a different application spectrum.

The lateral extension of the trench can be a diameter of the trench, which may for instance have a cylindrical shape. In another embodiment, the lateral extension is a side length of a trench, which, in a top view, is rectangular or quadratic. However, the geometrical shape of the trench is not limited to these mentioned examples. It can also have an irregular shape, wherein the lateral extension is to be understood as one among several different lateral extensions between opposite lateral edges of the trench.

The number of electrically conductive capacitor-electrode layers in the trench filling is in some embodiments increased to provide an even higher flexibility for forming multi-capacitor configurations. Suitably, the trench filling comprises at least five electrically conductive capacitor-electrode layers. In another embodiment, six or more capacitor-electrode layers are provided in the trench filling.

With the number of capacitor-electrode layers and dielectric layers in the trench filling increasing, it is advisable to also increase the lateral trench extension. In one embodiment, the trench extension is at least 20 micrometer. As will be described later in more detail, it is particularly advantageous in one embodiment to use a lateral extension of the trench that is equal to the lateral extension of a through-substrate via in the semiconductor substrate. A suitable maximum lateral extension that may be used is, assuming a circular trench shape, a trench diameter of approximately 80 to 100 micrometer. Calculations show that the achievable capacitance density of a multi-layer capacitor begins to saturate beyond this lateral extension.

In one embodiment, the capacitor-electrode layers are connected with a respective one of at least two capacitor terminals. The capacitor terminals provide an internal electrical interface for connecting one or more capacitor-electrode layers of the trench filling and another conductive layer, be it an input or output terminal of the trench multi-capacitor device or one or more other capacitor electrode layers of the trench filling. A capacitor terminal can also be used for a connection of a capacitor-electrode layer of the trench filling to the semiconductor substrate.

The number of capacitor terminals provided with the trench multi-capacitor device can be chosen according to the specific needs of a particular application. In some embodiments, only two capacitor terminals are required. Other applications require three or more capacitor terminals. The capacitor terminals can for instance take the form of internal contact pads on a first side of the semiconductor substrate or on a higher metal level of an interconnect stack.

The structure of the trench multi-capacitor device of the invention has the advantage of allowing the use of standard materials compatible with existing fabrication technologies for integrated circuits (IC). For instance, the dielectric layers of the trench filling can be made of $SiO_2$ or $Si_3N_4$, or silicon-oxynitride. The capacitor-electrode layers are in one embodiment made of in-situ doped polysilicon. Phosphorus is an example of a suitable dopant.

Even with these standard IC-compatible materials a total capacitance density of the trench filling can be achieved which amounts to at least 500 $nF/mm^2$. In one embodiment, more than 1 microfarad per square millimeter is achieved by providing a larger number of capacitor-electrode layers. The high total capacitance of these embodiments provides an enormous flexibility for the formation of different multi-capacitor configurations on the basis of the capacitor-electrode layers comprised in the trench in the semiconductor substrate. For example, in an embodiment that has at least five capacitor-electrode layers in the trench filling, the control unit is configured to generate control signals for assuming a respective one of a plurality of multi-capacitor configurations. The respective multi-capacitor configuration connects the capacitor-electrode layers so as to form
- either a series connection of capacitors,
- or a parallel connection of capacitors,
- or a series connection of a first number of capacitors and a parallel connection of a second number of capacitors.

Of course, if the flexibility can be lowered for a specific application, the control unit can be adapted accordingly. The same holds for the switching unit. The number of switches provided during fabrication can be reduced to the minimum number required for a respective specific application. However, the provision of a higher number of switches makes the trench multi-capacitor device more flexible as a platform suitable for different application scenarios.

In one embodiment, the trench multi-capacitor device has the switching unit and the control unit arranged on a different substrate than the trench in the semiconductor substrate. The trench multi-capacitor device of this embodiment preferable forms a system-in-package. In this structure, the use of high-ohmic silicon for the semiconductor substrate comprising the trench is advantageous for the integration of further passive components. Substrates for integration of passive devices such as capacitors, inductors and resistors are often based on high-ohmic silicon.

However, one embodiment forms a system-on-chip, which monolithically integrates active circuitry formed by the switching unit and the control unit. Either only one or both of the switching unit and the control unit can be integrated into the semiconductor substrate in alternative embodiments. Low-ohmic silicon, also referred to as active silicon, is preferably used for the semiconductor substrate of this embodiment. The lowest capacitor-electrode layer can be left floating, thus providing a shielding of the capacitor from the underlying substrate. This enables the realization of ultra-high capacitance densities also in a low-ohmic substrate. The semiconductor substrate in a system-on-chip may comprise doped wells of a first type and of a second type, which second type different from the first type. In this embodiment, the trench is arranged in a well of the first type, and the active circuit elements of the switching unit and the control unit are arranged in wells of the second type. The wells should be doped according to the requirements of the respective active or passive circuit element. The first and second type of the wells can differ in their conductivity type, e.g., n-type or p-type, or in their conductivity value, e.g., high-ohmic or low-ohmic.

It is observed that the provision of at least some of the switching elements of the switching unit and the reconfigurable capacitor unit on a common substrate is considered beneficial. In this manner, the interconnects between the switching elements and the capacitive structures can be made in a single technology. Moreover, the distance may be short. Examples of switches include pin-diodes, other diodes, bipolar and MOS transistors. The role of these switching elements will be understood by the skilled person, taking into account that most optimum changes of the voltage ratios are obtained by switching the capacitive structures from parallel to series configurations.

Suitably, use is made of transistors. It has been found that several manufacturing steps of a trench capacitor and a transistor can be combined. Moreover, the resulting transistor can be defined and designed in such a manner as to be very suitable for the purpose of a switching element for a reconfigurable capacitor unit with a low internal resistance. Usually, such a transistor will have dimensions that are fairly large compared to the transistors commonly designed in today's integrated circuits, but that is not problematic. Manufacturing steps that may be combined are the following:
- the provision of dopants for a first conductive electrode-layer in the trench capacitor and the dopants for definition of source and drain regions of the transistor (or alternatively collector-basis-emitter regions of a bipolar transistor).
- the use of the dielectric layer as dielectric of the capacitor and as gate dielectric
- the use of polysilicon as part of the trench filling and the use of polysilicon for definition of the gate of the transistor;
- the provision of contacts and interconnects However, it is not excluded that the transistors and the capacitors are made on different substrates and by assembly combined to a single carrier which allows to manufacture common interconnects. Such an approach is usually referred to as a 'seamless' integration, and is known per se.

It is further observed for clarity reasons that the term 'electrically conductive capacitor-layer' is intended to include a doped region in the substrate surface that is defined in the form of a layer. Such doped regions are frequently used as electrodes in trench devices. However, an electrode in the form of a separately deposited layer is believed to be technically better in view of the even lower ESR.

In one embodiment, the DC-to-DC converter is a switched converter. In a switched converter structure, the trench multi-capacitor device preferably comprises

- input terminals configured for application of a DC input voltage from an external voltage source to the trench multi-capacitor device;
- output terminals configured for providing a DC output voltage from the trench multi-capacitor device to an external load;
- wherein the switching unit is configured to form a first multi-capacitor configuration with at least two capacitors connected between the input terminals, and a second multi-capacitor configuration that comprises at least one output capacitor internally connected between the output terminals; and wherein
- the control unit is configured to generate and provide control signals to the switching unit for periodically switching between the first and second multi-capacitor configurations with a switching frequency.

This converter structure can be a purely capacitive DC-to-DC converter. Note that the output capacitor is internally connected between the output terminals, which means that it is not arranged on the side of the external load, but internally within the DC-to-DC converter. In this embodiment, the first multi-capacitor configuration forms the input side of the switching converter, and the second multi-capacitor configuration forms the output side. Both, input and output sides of the switching converter are thus realized by the capacitor-electrode layers of the trench.

In one embodiment, the control unit is configured to adjust the switching frequency to a switching-frequency value that minimizes an output impedance of the DC-to-DC converter and at the same time represents a minimum switching-frequency value in a set of switching-frequency values, which minimize the output impedance of the DC-to-DC converter.

This embodiment is based on the recognition that the output impedance of any capacitive DC-to-DC converter can be modeled as a voltage source with the desired output voltage in series with an output impedance $R_{out}$. For lower switching frequencies, the output impedance can be derived to be inversely proportional to the switching frequency and to the capacitance value used for capacitors in this switching frequency region. In contrast, for high switching frequencies above a threshold value, the output impedance remains constant as a function of the switching frequency, and is a function of the series resistance of the switches and of the duty cycle, at which the switches are addressed. The duty cycle represents the fraction of the switching period T, during which a switch is on. The optimum switching frequency thus is the threshold frequency, which minimizes the output impedance for optimum efficiency, and which at the same time forms the minimum switching frequency value, for which the output impedance in minimized. This also reduces switching losses associated with switching different groups of switches on and off for realizing the first and second multi-capacitor configurations of the DC-to-DC converter.

In many applications, the switching frequency should remain constant due to constraints of electromagnetic compatibility. The technology of the present invention allows forming an embodiment that is able to change the capacitance on the input side of the DC-to-DC converter depending on the output load. The output impedance of the converter can thus be lowered by increasing the pump-capacitance values in the first multi-capacitor configuration. Therefore, being able to change the multi-capacitor configuration offers a way to control the output voltage of the converter.

The output voltage can be kept constant at varying load. For this purpose, an embodiment of the trench multi-capacitor device has a load-sensor input associated with the control unit and configured for receiving information indicative of a given external-load impedance connected between the output terminals. In this embodiment, the control unit is configured to generate and provide control signals instructing the switching unit to change from a third multi-capacitor configuration, with which, at the given external-load impedance, the DC-to-DC converter exhibits a higher output impedance, to a different, fourth multi-capacitor configuration, with which, at the given external-load impedance, the DC-to-DC converter exhibits a lower output impedance. A load sensor connected with the load-sensor input can be comprised by the trench multi-capacitor device of this embodiment. Suitable load sensors are well known in the art.

Whereas the foregoing embodiment is suitable for operation at lower switching frequencies and for minimizing the output impedance value in the lower frequency range, another embodiment can be used as an alternative or in combination with it for keeping the output voltage of the DC-to-DC converter constant at varying load. For this purpose,

- the control unit of the trench multi-capacitor device has a load-sensor input for receiving information indicative of a given external-load impedance connected between the output terminals, and
- the control unit is configured to generate and provide control signals instructing the switching unit to assume, upon detecting a change of the external-load impedance from a first value to a second value, a fifth multi-capacitor configuration, which minimizes a difference between the respective output voltages of the DC-to-DC converter at the first and second value of the external-load impedance. The load sensor of this embodiment can also take the form of a load-change sensor.

In another embodiment, the control unit is configured to generate and provide control signals instructing the switching unit to connect the capacitor-electrode layers according to one of at least two different multi-capacitor-configurations forming DC-to-DC converters with different conversion ratios of input voltage and output voltage. The trench multi-capacitor device of this embodiment thus is configured to form different DC-to-DC converters, which increases its flexibility. Preferably, however, one predefined capacitive entity, i.e., capacitor or group of capacitors, is used for forming the output capacitance of the converter, regardless of its particular, i.e., parallel or series or, for more than two capacitors involved, combined parallel and series connection of the capacitors comprised by this capacitive entity. To this end, the control unit is configured in one embodiment to generate and provide control signals instructing the switching unit to use identical output capacitors in any of the at least two different DC-to-DC-converter configurations. As will be described in more detail with reference to the figures enclosed herein, this allows adapting to varying requirements of conversion ratio and break-down voltage. As mentioned, in this embodiment, the predefined output capacitors can be used in a series connection for one DC-to-DC converter configuration and in a parallel connection for another DC-to-DC converter configuration.

In one embodiment, the trench multi-capacitor device comprises at least four capacitor-electrode layers in the trench filling. In this trench multi-capacitor device, the switching unit is configured to connect the capacitor-electrode layers, as the first multi-capacitor configuration, to form a series connection of at least two capacitors between the input terminals of the input port, and, as the second multi-capacitor configuration, to form a connection of the at least two capacitors as output capacitors, suitable for providing the DC output voltage at the output terminals.

In a further embodiment, the DC-to-DC converter is a resonant converter. Having a configurable capacitance with the trench multi-capacitor device of the present invention is beneficial to be able to tune the resonance frequency of the resonant converter and the switching frequency in order to achieve a high-efficiency power conversion at different load values. One embodiment of the resonant DC-to-DC converter has input terminals configured for application of a DC input voltage from an external voltage source to the trench multi-capacitor device;

output terminals configured for providing a DC output voltage from the trench multi-capacitor device to an external load;

an LC tank comprising at least one inductor and at least one capacitor; wherein the switching unit is configured to switch between a connection of the LC tank with either the input terminals or the output terminals at a switching frequency;

wherein the switching unit is configured to connect the capacitor-electrode layers of the trench filling so as to respectively form one of at least two alternative multi-capacitor configurations, which form a part of the LC tank;

the control unit has a load-sensor input for receiving information indicative of a given external-load impedance connected between the output terminals; and wherein the control unit is configured to generate and provide control signals instructing the switching unit to operate, in dependence on the detected external load-impedance, with a respective switching-frequency value and a respective multi-capacitor configuration.

The trench multi-capacitor device can form a passive integration substrate of a system-in-package (SIP). It can integrate further passive components, such as inductors and resistors. In a further embodiment, the semiconductor substrate further comprises a through-substrate via extending from a first substrate side to an opposite second substrate side. The single-trench multi-capacitor and the through-substrate via are formed in respective trench openings via openings in the semiconductor substrate, which trench opening and via opening preferably have mutually equal lateral extensions. The trench multi-capacitor device of this embodiment forms a particularly cost-effective integration substrate for a system-in-package because the via opening and the trench opening in the semiconductor substrate can be fabricated simultaneously. This allows saving process steps otherwise required for separately fabricating the openings for through-substrate vias and for trench capacitors.

Another aspect of the present invention is therefore formed by a system-in-package that comprises a trench multi-capacitor device according to the invention or one of the embodiments of the trench multi-capacitor device described herein.

In a further aspect, the invention relates to the control method of the voltage ratio of the converter, i.e. the setting of the capacitances. In a most suitable embodiment hereof, the actual input voltage is first detected using a load sensor. Therewith, an adequate voltage ratio is defined and control signals are given. The load sensor has been described above. Sensing of the load could be executed at regular intervals and/or after obtaining specific signals from a microprocessor. This microprocessor may be internal or external to the control unit.

While it is evidently most suitable to switch the voltage ratio immediately to the desired value, this may alternatively be achieved using a feedback loop in an interative process.

Although the first application is evidently to obtain a constant input voltage for one or more electronic devices such as integrated circuits, not to exclude displays, cameras, microphones, light emitting diodes, speakers and the like, applications of the invention are not limited thereto. Alternative applications include:

the regeneration of energy after use: generally, any unused power at the output of a circuit will be dissipated. With the converter of the invention, such non-usurpated energy, for instance a current with a rest voltage of for instance 0.2 V, may be converted into a higher value, such as 1.1, 1.8 or even 3.0 V and re-used as part of the input voltage, or alternatively the output voltage of the DCDC-converter;

the provision of a higher voltage to an electronic device temporarily, e.g. to provide additional output power. Such may be useful for LEDs, flashlights etc, but also for a power amplifier that has to communicate with a network at a long distance. Alternatively, one may decide to provide a lower output voltage. The temporarily different voltage will be given on the basis of a signal sent to the control unit.

the provision of different voltages to devices that are part of a single system.

Preferred embodiments of the invention are also defined in the dependent claims.

BRIEF DESCRIPTION OF THE DRAWINGS

These and other aspects of the invention will be apparent from and elucidated with reference to the embodiment(s) described hereinafter. In the following drawings These and other aspects of the invention will be apparent from and elucidated with reference to the embodiment(s) described hereinafter. In the following drawings

DETAILED DESCRIPTION OF EMBODIMENTS

Figure 1:
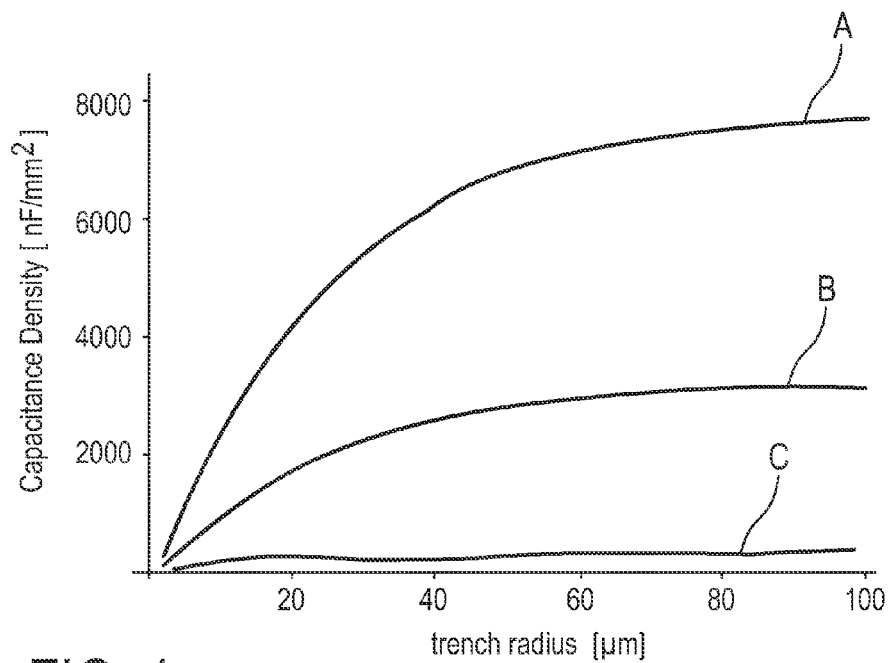
FIG. 1 is a diagram showing calculations of capacitance densities that can be achieved with a trench capacitor using multiple layer stacks.

FIG. 1 is a diagram showing calculations of capacitance densities that can be achieved with a trench capacitor using multiple layer stacks. In the diagram the capacitance density in units of $nF/mm^2$ (Nanofarad per square millimetre) is plotted as a function of a radius of a cylindrical trench, in which the trench capacitor is formed, in units of micrometer. The three curves A, B, and C shown were calculated for three different material combinations and processes that have values of a dielectric breakdown field, which values differ by a factor of 2. The breakdown field is considered as being proportional to the inverse of the square root of the relative dielectric constant of the dielectric material used for the dielectric layers of the trench capacitor. A constant breakdown voltage of the capacitor of 30 V was used as a constraint for all three material combinations and processes. An additional constraint was used for determining the respective metal thickness for a respective material combination, namely, the constraint that the Q-factor of the trench capacitor remains the same for all material combinations at equal height levels within the trench. Q, i.e., $1/\omega CR$, where $\omega$ denotes the angular frequency, C the capacitance, and R the resistance, changes inversely proportional to the height level as measured from the bottom of the trench.

The given assumptions and constraints allowed deriving suitable thickness values of the capacitor-electrode layers and dielectric layers for the trench filling, thus allowing to derive the respective capacitance densities of a trench capacitor with two capacitor electrodes distributed over the layer stack. Calculated thicknesses of the dielectric layers for the cases of a relative dielectric constant $\in_r$ of 1, 10, 100, and 1000 were for the case represented by curve A 15, 47.4, 150, and 474 nm, respectively. The calculated metal layer thicknesses were 16.7, 52.7, 167 and 527 nm, respectively. For the material and process combination with half the breakdown field (curve B), the resulting dielectric layer thicknesses are doubled and the metal layer thicknesses are decreased by a factor of 2, in comparison with the mentioned values for the case of the higher breakdown voltage, in order to maintain the Q value at equal pore-radius values. For instance, in the case of $\in_r=1000$, the dielectric layer thickness is 949 nm and the metal layer thickness is 264 nm.

The layer stacks used for the calculations in the three cases have at least three dielectric layers, thus at least four capacitor-electrode layers in the trench capacitor. The capacitor thus forms a MIMIMIM capacitor, at least, the addition of more metal layers M and more insulator layers I or, in other words, dielectric layers being possible, dependent on the given constraints, as explained.

The capacitance density represented by the three curves exhibits an approximately linear increase with increasing pore radius for radius values up to about 20 micrometer, merging into a sublinear and saturation range for higher radius values. Generally, as can be expected, the capacitance density achievable for the material and process combination with a higher breakdown field are higher. For a pore radius of 20 micrometer, the capacitance density of the material and process combination with higher breakdown field is about 4000 $nF/mm^2$, while it is at about 1500 for the material and process combination with lower breakdown field. As it turns out, also the maximum achievable capacitance density in the saturation range, taken at a pore radius of approximately 100 micrometer, differs by a factor of about 2.5 between the two material combinations and processes of curves A and B. Under the given constraints, the shown capacitance density curves were independent from the relative dielectric constant.

The diagram shows that capacitance densities in the range of 2000 to 4000 $nF/mm^2$ are achievable for a pore radius of approximately 20 μm (see curves A and B). Even for lower pore-radius values in the range of 5 to 10 μm, the achievable capacitance under the mentioned constraints is higher than 1000 $nF/mm^2$.

Figure 2:
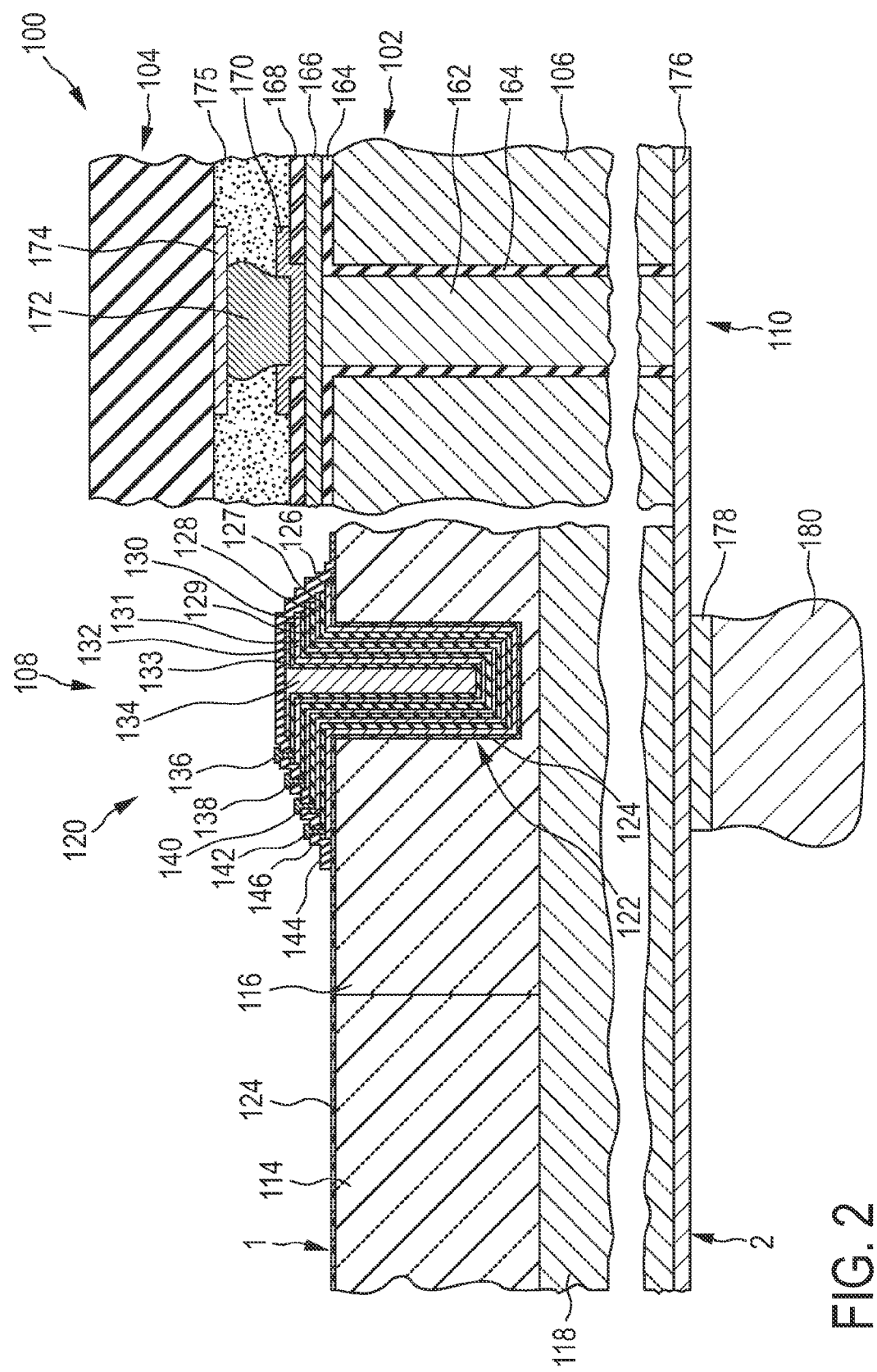
FIG. 2 shows a schematic cross sectional view of a stacked chip assembly comprising a trench multi-capacitor device and an active die.

FIG. 2 shows a schematic cross sectional view of a stacked chip assembly 100 comprising a trench multi-capacitor device 102 and an active die 104. The trench multi-capacitor device 102 forms an integration substrate 102 for a system-in-package containing the stacked chip assembly 100. The trench multi-capacitor device will also be referred to as the integration substrate.

The integration substrate 102 of this embodiment is based on a low-ohmic silicon substrate, and obtained from a low-ohmic silicon wafer. Any low-ohmic substrate material could be used. However, it is particularly cost-saving to use techniques practiced in industrial fabrication lines. Therefore, a low-ohmic silicon substrate is used for the present embodiment.

FIG. 2 shows two sections 108 and 110 of the integration substrate 102, which will also be referred to as the capacitor section 108 and the via section 110. The semiconductor substrate 102 may be used for other integrated passive devices, such as resistors and inductors. However, further passive devices are not shown for reasons of graphical simplicity, as are any details of the active die 104.

The following description will first turn to the capacitor section 108. The capacitor section 108 is provided on a first side 1 of the integration substrate.

The integration substrate 102 has wells 114 and 116 and underneath the wells, a lower substrate region 118, which extends to a second substrate side 2. The depth extension of the lower substrate region 118 is chosen suitably to provide sufficient mechanical stability. Typically, the final thickness of the integration substrate 102 is reduced in comparison with the initial thickness of the Silicon wafer used. This can be achieved by thinning the wafer from the second substrate side 2 during the fabrication process of the integration substrate.

In the well 116, a trench capacitor is 120 is arranged. The trench capacitor 120 is formed in a cylindrical trench 122. The trench 122 has a diameter of about 10 micrometer in the present embodiment. Higher diameters can be chosen according to the application requirements, for instance 20, 30 or 40 micrometer.

The well 116 has a high-dose implantation to render the substrate part next to the trench capacitor 120 highly conductive (n++). This substrate part can form a bottom electrode of the capacitor structure.

A first dielectric layer 124 separates the well 116 from the layers of the trench capacitor 120. The first dielectric layer 124 extends also on the surface of the integration substrate 102.

The trench capacitor has an alternating layer sequence of first to fifth electrically conductive polysilicon layers 126, 128, 130, 132, and 134, and first to fifth dielectric layers 124, 127, 129, 131, 133, and 135. The complete layer stack of this layer sequence forms a filling of the trench opening 122. The first to fifth polysilicon layers form electrically conductive capacitor-electrode layers in the present embodiment. Neighboring polysilicon layers are electrically isolated from each other by a respective dielectric layer. The dielectric layers are made of silicon oxide, e.g., $SiO_2$, silicon nitride, e.g., $Si_3N_4$, (or silicon oxynitride. Other embodiments use other suitable materials for the capacitor-electrode layers and the dielectric layers, which materials suitably are equally compatible with a front-end technology used for fabrication of the integration substrate. In particular, compatibility of the layer materials with existing CMOS and BiCMOS technology is preferred.

The polysilicon layers and the dielectric layers extend along the side and bottom walls of the trench opening 122 and therefore each have a shape corresponding to the letter "U", or, in other words and in consideration of the three-dimensional shape of the structure, corresponding to a cylinder wall; except for the innermost polysilicon layer 134, which forms a filled cylinder to complete the trench filling. Variants of this structure, which are not shown here, use different trench or layer geometries. Instead of a cylindrical trench, other trench forms with an elliptical, oval, or rectangular footprint may be used. Adherence to a specific geometrical shape in a strict mathematical sense is not a requirement. In the corners between different sidewalls of the trench, the layer continuation can also be more or less curved instead of a sharp perpendicular corner.

The stack of capacitor-electrode layers and dielectric layers also extends along a section of the substrate surface on the first substrate side 1 on both sides of the trench. A step-pyramidal structure is fabricated from the stack in the back-end processing, leaving terraces for contact structures 136, 138, 140, and 142 that connect to the first to fourth capacitor-electrode layers, respectively, to respective internal terminals provided on the first substrate side 1, of which only an internal terminal 144 is shown. The contact structures are connected to their respective internal terminal by a respective metallization, an example of which is shown under reference label 146. The metallization 146 leads to or, in other words, merges into the internal terminal 144 arranged on the first substrate side 1 and on the dielectric layer 124. Interlevel dielectric layers, summarized by reference label 148, cover the step-pyramidal surface of the trench capacitor except for contact openings, which are filled with the mentioned contact structures.

Figure 3:
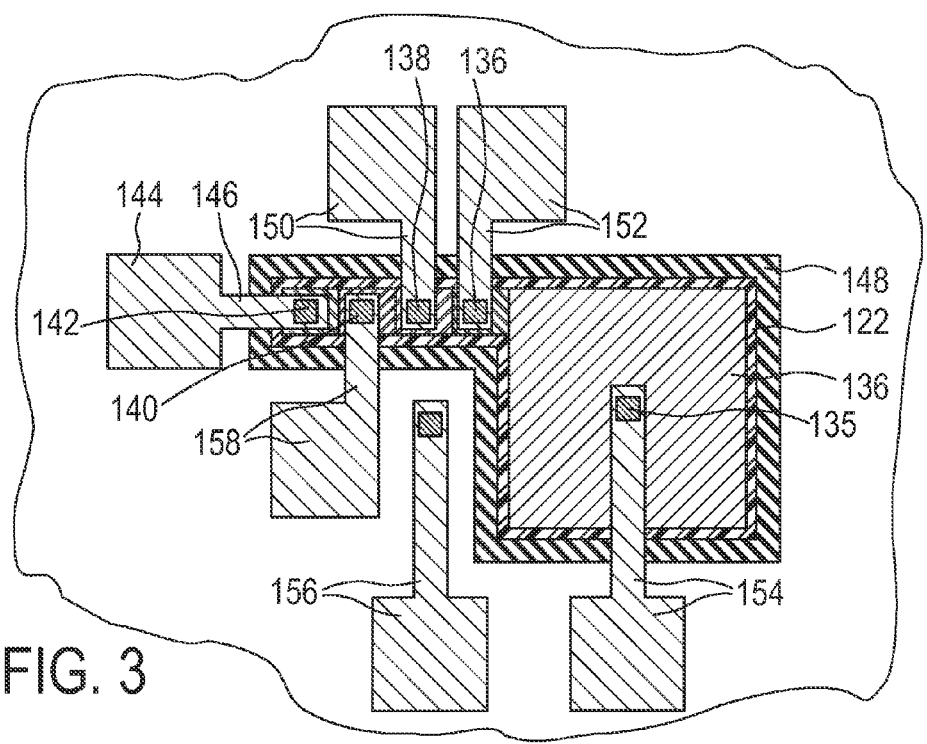
FIG. 3 shows a schematic top view of the trench capacitor in the integration substrate of FIG. 2.

In order to explain the complete contact arrangement of the trench capacitor 120, reference is now made in parallel to FIGS. 2 and 3 in parallel.

FIG. 3 shows a schematic top view of the trench capacitor 120 in the integration substrate 102 of FIG. 2. As can be seen in FIG. 3, additional internal terminals and metallizations 150 to 158 are provided on the trench capacitor. Each of the internal terminals 150 to 158 connects to one of the contact structures 135, 136, 138, 140, and 142, and thus to one of the first, second, third, fourth and fifth capacitor-electrode layers. The interlevel dielectric layers 148 are shown in FIG. 2 only by an outer edge that extends on the substrate and the first dielectric layer. As is clear from the representation in FIG. 2, this does not correspond to the real extension of the interlevel dielectric layers.

In another embodiment that is not shown in the FIGS., the internal terminals are arranged on the second substrate side 2 and connected to the contact structures by the through-substrate via 162 and a suitable arrangement metallization layers on the first and second substrate side. This way, the capacitor can be connected to circuits on a die or on a printed circuit board that faces the second substrate side 2 of the integration substrate 102.

By adding active devices, like suitable switches, the realization of multiple-layer stack capacitors with switches connected to each terminal of the capacitor is realized. Using a dedicated selection mechanism as described below for a few examples, one can reconfigure the capacitance value by switching on and off the desired terminals.

It thus becomes clear from the description in the previous paragraphs that the individual capacitor electrode-layers provided by this trench capacitor can be connected in any desired manner by suitable switching using switching elements. For instance, a parallel switching of the first, third and fifth capacitor-electrode layers could form a first capacitor electrode, and a parallel switching of the second and fourth capacitor-electrode layers and of the well could form a second capacitor electrode. Given the mentioned geometrical parameters of this multi-capacitor configuration, a very high capacitance density of about 1 microfarad per square millimeter would be achieved. More examples of useful multi-capacitor configurations of the capacitor-electrode layers will be provided further below. Using a switching control, the multi-capacitor configurations can be changed to form another configuration.

The next paragraphs will turn to the via section 110 of the integration substrate. The via section 110 has a through-substrate via 162 extending from the first substrate side 1 to the second substrate side 2. The through-substrate via of this embodiment has a lateral extension that is equal to that of the trench 122. This allows a concurrent fabrication of the trench 122 for the trench capacitor 120 and of a via opening for the through-substrate via 162 in a single etching step. A different depth extension can be achieved by interrupting the etching process and selectively masking only the trench section 108, in order to provide a protection of the trench section 108 during a continued etching process that serves to finish the via opening to a desired depth. Note that the via opening need not be etched through the complete substrate. A later backside thinning step (grinding, polishing, etching, or a combination) can be used to open the via opening. The via is filled with a metal. Suitable metals for the via filling are Cu, Al, or an alloy of Cu and Al. A via insulation layer 164 is deposited on the sidewalls of the via opening between the substrate 102 and the via filling. If Cu is used for the via filling, a diffusion barrier is also provided between the via filling and the substrate. This can be an extra diffusion barrier layer (not shown). As an alternative, a material for the via insulation layer 164 that at the same time is electrically insulating and prevents diffusion of Cu into the substrate can be used. A metallization layer 166 connects the via to a contact layer 170, which is otherwise separated from the metallization layer by a dielectric layer 166.

The active die 104 is connected with the integration substrate through a contact layer 174, a bump 172 and the contact layer 170. An electrically insulating filling 175, such as a polyimide filling is arranged between the integration substrate 102 and the active die 104. The active die 104 contains active circuitry, which is connected with the trench capacitor 120 through a switching unit.

The switching unit can be integrated either into the active die 104 or into the integration substrate 102. Likewise, a control unit can be integrated either into the active die or into the integration substrate. The control unit is connected with the switching unit and is configured to generate and provide to the switching unit respective control signals for forming a respective one of a plurality of multi-capacitor configurations using the capacitor-electrode layers of the trench filling. The trench multi-capacitor device configuration can be set by switching in an off-state before operation of a selected multi-capacitor configuration, or even during operation of the device.

On the second substrate side 2, a metallization layer 176 connects the through-substrate via 162 with a bump 180 for connection with another active a printed-circuit board (not shown) or another active die.

In an alternative embodiment, which is not shown in the FIGS., the trench capacitor is not arranged in a well with increased doping concentration. In that alternative embodiment, the outermost capacitor-electrode-layer 126 is left floating, providing a shielding of the capacitor structure from the underlying low-ohmic substrate. Whether in the present embodiment or this alternative, a monolithical integration of active devices next to the passives in the integration substrate is enabled and makes reconfigurable capacitors an option both in System-on-Chip (SOC) and in System-in-Package (SIP) approaches.

Note that in a variant of the embodiment of FIGS. 2 and 3 the integration substrate 102 is provided without a through-substrate via. In that case, no electrical connections from the first to the second substrate side are provided, and all electrical connections of the integration circuits to one or more external dies are provided from the first substrate side 1.

Figure 4:
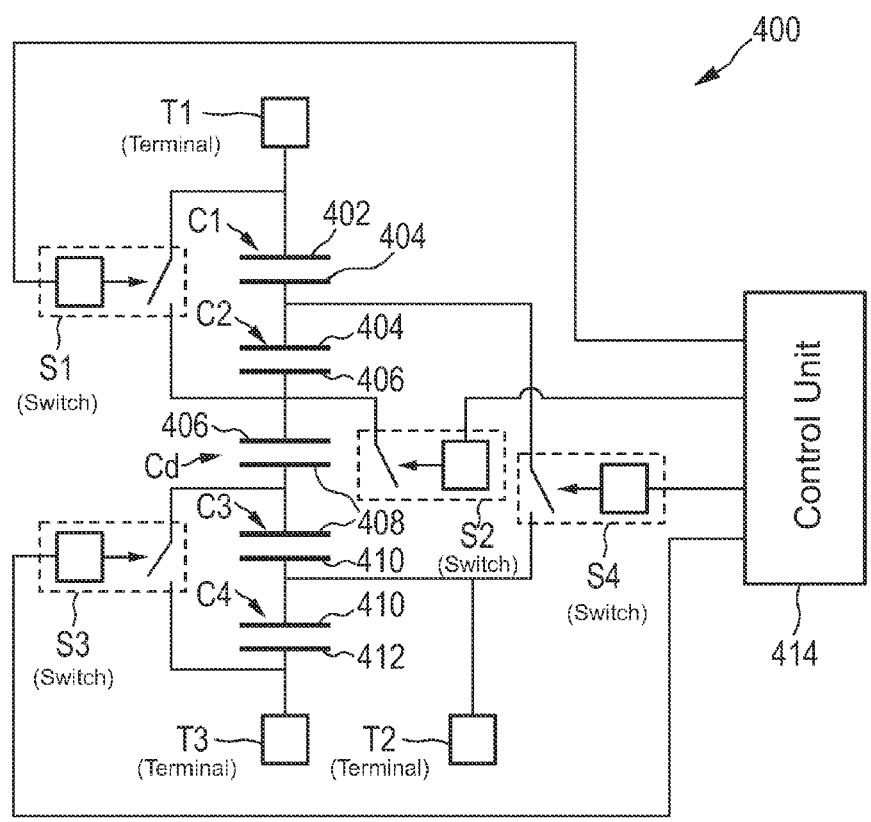
FIG. 4 shows a schematic circuit diagram representing a trench multi-capacitor device for an application as a reconfigurable capacitor that provides four different capacitance values.

FIG. 4 shows a schematic circuit diagram representing a trench multi-capacitor device for an application as a reconfigurable capacitor. The illustration corresponds to a usual electric circuit diagram. However, it should be noted that this circuit diagram is provided by a single trench multi-capacitor device, in which the capacitor electrodes are formed by capacitor-electrode layers. More specifically, four unit capacitors C1 to C4 are used in the present embodiment. Since in the technology described herein the top capacitor electrode of one capacitor forms the bottom electrode of the next capacitor, the individual capacitor electrodes of the capacitors C1 to C4 are labeled with reference labels for clarity. The capacitor electrodes are formed by five capacitor-electrode layers 402 to 410 of the trench filling, and by a well 412 surrounding the trench.

The illustration of FIG. 4 shows that one capacitor formed by the capacitor-electrode layers 406 and 408 is not used for the reconfigurable capacitor device 400. This unused capacitor is marked by Cd, as a dummy capacitor. The dummy capacitor Cd is not used because the combination of the capacitors C1, C2 and C3, C4 need to be isolated from each other. The reconfigurable capacitor 400 further has four switches S1 to S4. The switch S1 is interconnected between a terminal T1, which is connected with the capacitor-electrode layer 402, and the capacitor-electrode layer 406. The second switch S2 is interconnected between the capacitor-electrode layer 406 and the capacitor-electrode layer 408. The third switch S3 is interconnected between the capacitor-electrode layer 408 and a third terminal connected with the capacitor electrode formed by the well 412. The fourth switch S4 is interconnected between the second capacitor-electrode layer 404 and the capacitor-electrode layer 410. A terminal T2 is interconnected between the switch S4 and the capacitor-electrode layer 410. A control unit 414 is connected with the switches S1 to S4. The control unit 414 is configured to generate and provide to the switches S1 to S4 respective control signals for forming a respective one of a plurality of possible multi-capacitor configurations using the capacitor electrode layers 402 to 410 and the well 412. More specifically, four different multi-capacitor configurations can be made with the trench multi-capacitor device 400 of FIG. 4. The configurations are:

a) In a first configuration, the capacitors C1 to C4 are connected in series. In this configuration, switch S2 is closed and switches S1, S3, and S4 are open. The terminals T1 and T3 are used.

b) In a second multi-capacitor configuration, the capacitors C1 to C4 are connected in parallel. In this configuration, the switches S1 to S4 are closed, i.e., connecting, and the terminals T2 and either T1 or T3 are used. T1 and T3 are equivalent in this multi-capacitor configuration.

c) In a third multi-capacitor configuration, the capacitor C1 is connected in series with the capacitor C2, which is configured in series with a parallel configuration of the capacitors C3 and C4. In this multi-capacitor configuration, the switches S2 and S3 are closed, while the switches S1 and S4 are open. The terminals T1 and T2 are used.

d) In a fourth multi-capacitor configuration, the capacitor C1 is connected in series with a parallel configuration of the capacitors C2, C3, and C4. In this configuration, the switch S1 is open and the switches S2 to S4 are closed. The terminals T1 and T3 are used.

It becomes clear from the previous description that the trench multi-capacitor device 400 of FIG. 4 allows to form four different capacitance values. In comparison with a situation of having four individual capacitors with different values, the trench multi-capacitor device 400 requires one connection less, namely, seven instead of eight connections.

Figure 5:
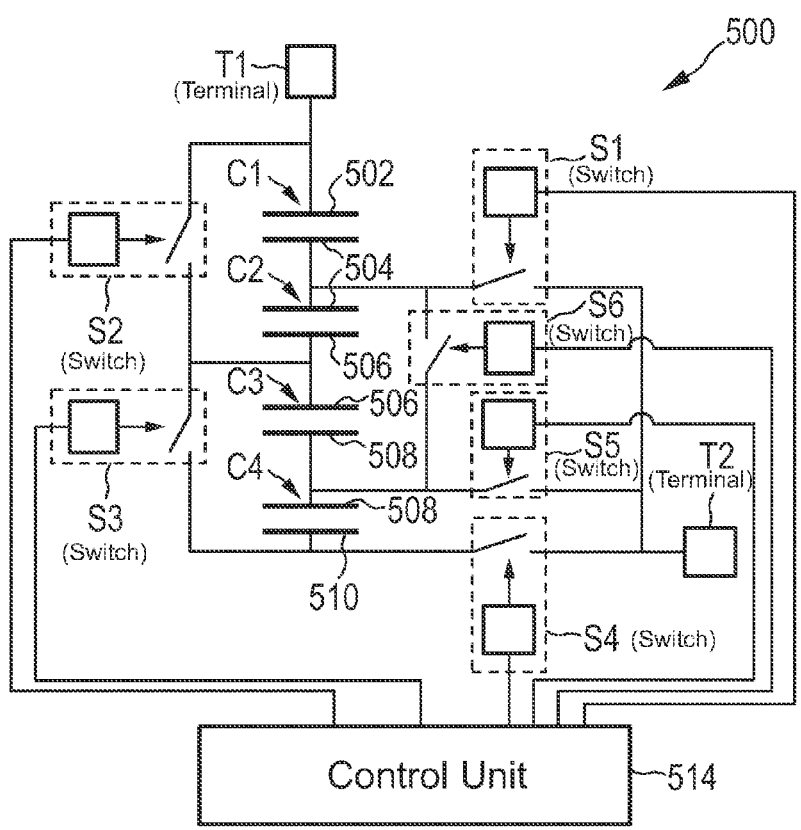
FIG. 5 shows a schematic circuit diagram representing another trench multi-capacitor device for application as a reconfigurable capacitor that provides four different capacitance values.

Note that it is also possible to use all capacitors in the stack of the trench capacitor for a reconfigurable capacitor device that provides four different capacitance values. This is illustrated by the circuit diagram of FIG. 5. However, this requires the same number of connections of the trench capacitor to external units as would be required for four individual capacitors with different capacitance values. The trench multi-capacitor device 500 of FIG. 5 uses five capacitor-electrode layers 502 to 510 to form four capacitors C1 to C4. A first switch S1 is interconnected between the capacitor-electrode layers 504 and a terminal T2, which is connected to the capacitor-electrode layer 510 of capacitor C4, if switches S4 or S5 are closed, i.e., conducting. A second switch S2 is interconnected between a terminal T1, which is connected with the capacitor-electrode layer 502 of capacitor C1 and the capacitor-electrode layer 506. A third switch S3 is interconnected between the capacitor-electrode layer 506 shared by capacitors C2 and C3 and the capacitor-electrode layer 510 of capacitor C4. A fourth switch S4 is interconnected between the capacitor-electrode layer 510 and the terminal T2. A fifth switch S5 is interconnected between the capacitor-electrode layer 508 shared by capacitors C3 and C4 and the terminal T2. A sixth switch S6 is interconnected between the capacitor-electrode layer 504 and the capacitor-electrode layer 508.

All switches S1 to S6 are connected with a control unit 514, which is configured to generate and provide respective control signals for forming a respective one of the following multi-capacitor configurations:

a) In a first multi-capacitor configuration, the capacitors C1 to C4 are connected in series. In this configuration, the switch S4 is closed, while all other switches S1 to S3 and S5, S6 are open.

b) In a second multi-capacitor configuration, the capacitors C1 to C4 are connected in a parallel configuration. For this multi-capacitor configuration, the switches S1, S2, S3, and S5 are closed, while the switches S4 and S6 are open.

c) In a third multi-capacitor configuration, the capacitor C1 is connected in series with C2, which is connected in series with a parallel configuration of the capacitors C3 and C4. In this configuration, the switches S3 and S5 are closed, while the switches S1, S2, S4, and S6 are open.

d) In a fourth multi-capacitor configuration, the capacitor C1 is connected in series with a parallel configuration of the capacitors C2, C3, and C4. For achieving this configuration, the switches S3, S4, and S6 are closed, and the switches S1, S2, and S5 are open.

It becomes clear that with a trench multi-capacitor device a high flexibility in generating various capacitance values in a reconfigurable capacitance stack is achieved. It will be clear to those of ordinary skill in the art, how either the number of connections compared to having individual capacitors, each with two terminals, can be lowered, or how various combinations of capacitors in a stack can be made.

Figure 6:
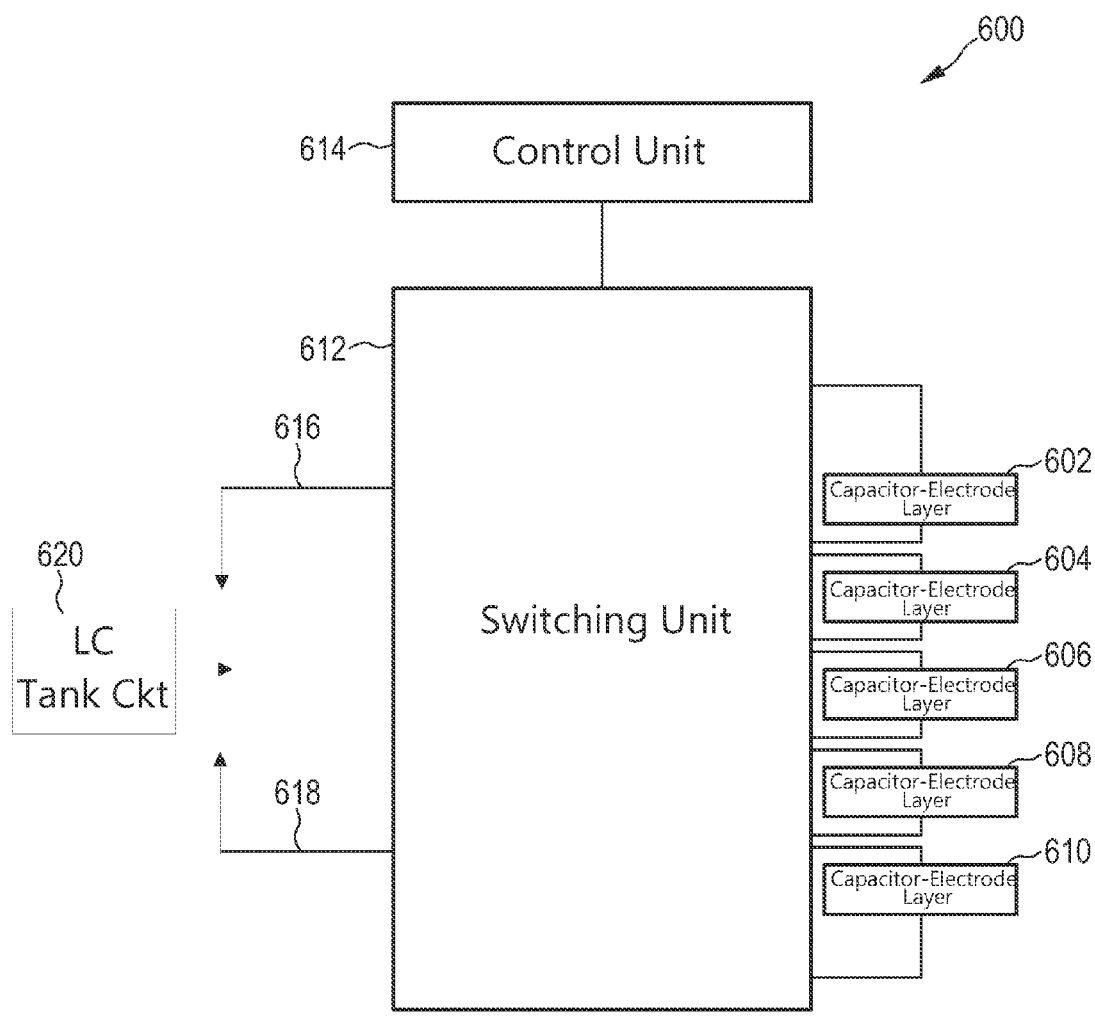
FIG. 6 shows a simplified block diagram of a trench multi-capacitor device.

FIG. 6 shows a simplified block diagram of a trench multi-capacitor device 600. The trench multi-capacitor device 600 has a trench capacitor with capacitor-electrode layers 602 to 610. The capacitor electrode layers are represented by blocks in the present illustration. It is understood that a substrate region used as a capacitor electrode is equally represented by a block. Each of the capacitor-electrode layers 602 to 610 is connected with a switching unit 612 that comprises a plurality of switching elements, which are electrically interconnected between the capacitor electrode layers. The details of the switching unit are not shown in the simplified block diagram of FIG. 6. However, it is clear to a person of ordinary skill in the art from the description provided herein how to design and fabricate a switching unit 612 according to a given application case of the trench multi-capacitor device 600.

The state of individual switching elements comprised by the switching unit 612 are controlled by a control unit 614, which provides control units for setting individual switching elements into either a first or second switching state so as to connect or disconnect different capacitor-electrode layers to each other or from each other. Input and output voltages can be provided through respective terminals of the switching unit 612. Two input/output lines 616 and 618 are shown in FIG. 6. In an example embodiment, there is an LC tank 620 circuit comprising at least one inductor and at least one capacitor. The switching unit 612 is configured to switch between a connection of the LC tank with either input terminals 616 or 618 at a switching frequency. The switching unit is configured to connect the capacitor-electrode layers of the trench filling so as to respectively form one of at least two alternative multi-capacitor configurations, which form a part of the LC tank 620. However, the number of input and output terminals can be varied according to the needs of a particular application.

The following description turns to an application of the trench multi-capacitor device in DC-to-DC converters.

DC-to-DC conversion is used in many applications. For example, in hand-held battery-powered devices, the battery voltage needs to be transformed into a plurality of supply voltages needed for various integrated circuits present inside the device. Time-discrete or switched converters have the advantage of allowing both up- and down-conversion of the input voltage. Depending on the applications, efficiencies above 90% are possible, which forms a clear advantage compared to linear regulators comprising dissipative elements such as transistors.

Figure 7:
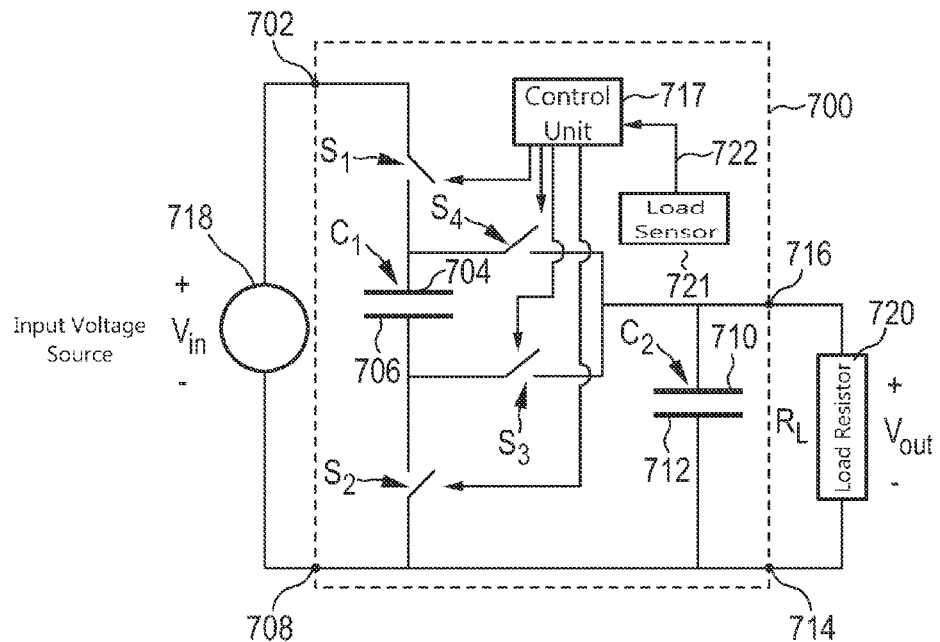
FIGS. 7 and 8 show circuit-diagram representations of trench multi-capacitor devices for application as DC-to-DC converters.
Figure 8:
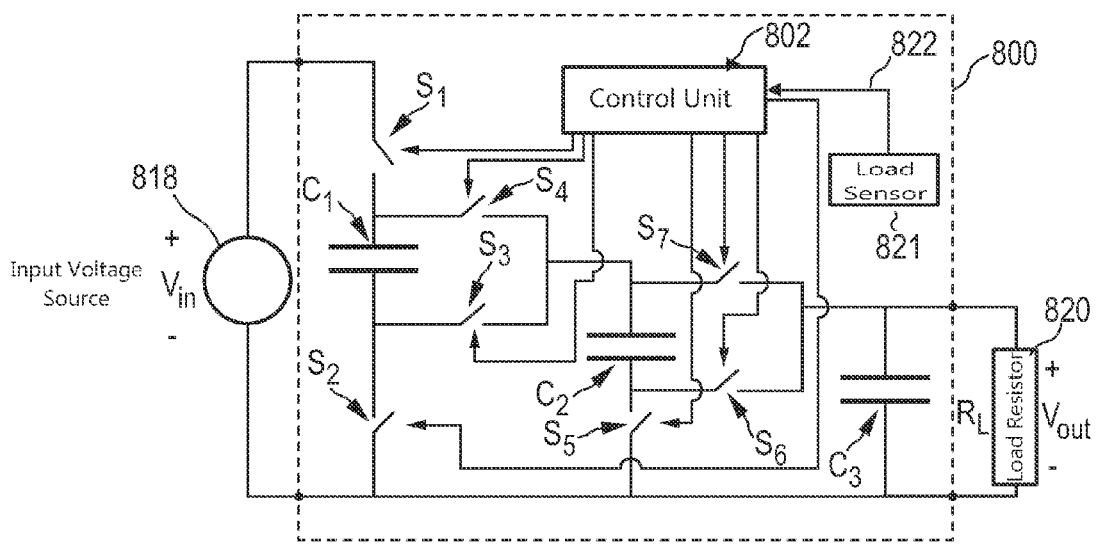

FIGS. 7 and 8 show circuit-diagram representations of trench multi-capacitor devices for application as a DC-to-DC converter. The trench multi-capacitor devices of FIGS. 7 and 8 will in the following be referred to in short as DC-to-DC converter or simply as converter.

The converter 700 of FIG. 7 has a multi-capacitor configuration that is formed by two capacitors C 1 and C2. The capacitors can be connected in two different multi-capacitor configurations corresponding to two different operation phases of the converter 700. As before, the switching between the two multi-capacitor configurations is performed by a switching unit comprising switches SI to S4 with a control input driven by a control unit 717. Control unit 717 has a load sensor input 722 from a load sensor 721; the load sensor input 722 receives information indicative of a given external-load impedance 720 connected between the output terminals 714 and 716. A switch S1 is interconnected between a first input terminal 702 and an upper capacitor electrode layer 704 of capacitor C1. A second switch S2 is interconnected between a lower capacitor-electrode layer 706 and a second input terminal 708 of the converter. The terms "upper" and "lower" capacitor-electrode layer are used with reference to the graphical representation in FIG. 7. They do not indicate a relation of the capacitor-electrode layers 704 and 706 within the trench of the trench multi-capacitor device 700.

A third switch S3 is interconnected between the lower capacitor-electrode layer 706 of capacitor C1 and an upper capacitor-electrode layer 710 of capacitor C2. A fourth switch S4 is interconnected between the upper capacitor-electrode layer 704 of capacitor C1 and the upper capacitor-electrode layer 710 of capacitor C2. The switches S3 and S4 are in a parallel configuration. A lower capacitor-electrode layer 712 of capacitor C2 is connected with an output terminal 714. Similarly, the upper capacitor-electrode layer 710 of capacitor C2 is connected with an output terminal 716 of the converter. As mentioned, the control unit 717 is connected with the switching unit formed by the switches S1 to S4. The control unit 717 serves to control the switching state of the switches S1 to S4 individually. In operation of the DC-to-DC converter, in a first phase, all odd-numbered switches are set to their conducting, i.e. closed states. That is, by letting the switches S1 and S3 connect with the capacitors C1 and C2 in series, the series connection of C1 and C2 is charged to the input voltage $V_{in}$. In a subsequent second operation phase of the DC-to-DC converter 700, the control unit opens the odd-numbered switches and closes the even-numbered switches S2 and S4.

FIG. 7 also schematically shows an input voltage source 718 connected between the input terminals 702 and 708 and a load resistor 720 connected between the output terminals 714 and 716. In a second operation phase, the control unit opens all odd-numbered switches and closes all even-numbered switches to provide a parallel connection of the capacitors C1 and C2 in parallel to the load resistor 720 at the output of the DC-to-DC capacitor. Consequently, the ratio of input and output voltage is 2:1.

In a similar manner, the DC-to-DC converter 800 of FIG. 8 operates to provide a ratio between the input voltage and the output voltage of 3:1. There is an input voltage source 818. The converter 800 has three capacitors C1 to C3 and seven switches SI to S7, and a control unit 802. Control unit 802 has a load sensor input 822 from a load sensor 821; the load sensor input 822 receives information indicative of a given external-load impedance 820. Details of the configuration can be derived from the circuit diagram of FIG. 8 and are closely analogous to the circuit configuration of the converter 700. Falling operation, the converter 800 is operated in a first phase to have switches S 1, S3 and S6 conducting and all other switches non-conducting. Therefore, all capacitors C 1 to C3 are placed in series and charged to Yin. In a subsequent second operational phase of the converter 800, the switches SI, S3, and S6 are switched from the conducting to their non-conducting state, and the switches S2, S4, S5 and S7 are switched from their non-conducting to their conducting states. This way, a parallel connection of the capacitors C 1 to C3 is achieved, which is placed in parallel to the load resistance ($R_L$) 820 at the output of the converter 800.

While the circuit diagrams as such could also be used DC-to-DC converters using conventional capacitors, the realization of such DC-to-DC converters with a trench multi-capacitor device as described herein has several advantages. One advantage is that the trench multi-capacitor device provides a high capacitance density per unit area. This allows to realize an integrated capacitive converter, which has capacitors of large capacitance, which leads to a high efficiency. In conventional capacitive converters, efficiency is an issue. Since each time, that a capacitor is charged or discharged over a voltage difference $\Delta V$, an energy $\frac{1}{2}C\Delta V^2$ is lost, capacitive converters work most efficiently, when the charge packages transferred through the converter are relatively small compared to the charge stored in the capacitors. In other words, $\Delta V$ should be small in comparison with the total voltage applied over the capacitor. This means that for achieving an optimum efficiency, a voltage ripple across the capacitors should be kept small. For the capacitive converter in FIG. 7, this means that the voltage across each capacitor should remain close to $V_{in}/2$, and for the capacitive converter in FIG. 8, this means that the voltage across each of the capacitors C1 to C3 should remain close to $V_{in}/3$, in both operational phases. Depending to the expected load current $V_{out}/R_L$ this means that the capacitors of the converter must become rather large to provide an optimum efficiency. This cannot be realized at an acceptable cost with previously known processes of integrated-circuit fabrication. It is only with the technology described in the present application that an economic way of providing a high capacitance density per unit area in a SOC or SIP framework is achieved, which in turn allows providing integrated capacitors with a capacitance large enough to achieve a converter with high efficiency.

A second advantage of the trench multi-capacitor devices of FIGS. 7 and 8 in comparison with previously known DC-to-DC converters is the fact that floating capacitors can be realized with a low parasitic capacitance to the substrate. The requirements of floating capacitors means that the bottom plate should not be connected to ground because otherwise stacking the capacitors in series would short the bottom capacitors. In the trench multi-capacitor device that is used for realizing the DC-to-DC converter 700 and 800, any of the capacitor-electrode layers in the layer stack of the trench filling can be used as a bottom plate for the corresponding capacitor. While in known IC technologies the creation of floating capacitors is also possible, the parasitic capacitance between the bottom plate and the substrate (ground) is known to be come on the order of 10% of the capacitance value itself in know IC technologies. Such a high parasitic capacitance of the bottom plate of each capacitor to ground is undesired because a part of the charge "pumped" through the converter will be consumed in charging and discharging these parasitic capacitors. This decreases the efficiency. However, the trench multi-capacitor device of claim 1 leaves enough room to properly design the characteristics of the bottom dielectric layer in order to provide a low parasitic capacitance to the substrate.

A third advantage of the technology represented by the DC-to-DC converters 700 and 800 in exemplary manner relates to the output impedance of the converter. It can be derived that any capacitive converter can be modelled as a voltage source with the desired output voltage, in series with an output impedance $R_{out}$.

Figure 9:
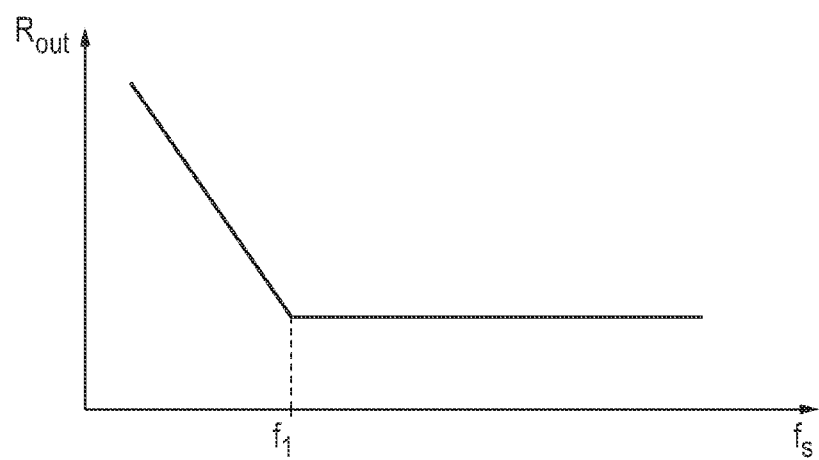
FIG. 9 shows an illustration of the dependence of $R_{out}$ on the converter switching frequency $f_s$.

In this context, an illustration of the dependence of $R_{out}$ on the converter switching frequency $F_s$ is shown in FIG. 9. For lower switching frequencies, the RC time of switch resistance and pump capacitors is much lower than the time period of switching, which is $1/f_s$. The impedance $R_{out}$ can be derived as being inversely proportional to the switching frequency and the capacitance value used for the capacitors in this range of the switching frequency. This relation is shown in FIG. 9 for switching frequencies lower than a threshold switching frequency $f_1$. For higher switching frequencies $f_s$, the RC time of the switch resistance pump capacitance is much higher than the switching time period. In this range, shown in the diagram of switching frequencies larger than the threshold frequency $f_1$, the output impedance $R_{out}$ remains constant as a function of the switching frequency. The value assumed in this switching-frequency range is a function of the series resistance of the switches and of the duty cycle, at which the odd-numbered and even-numbered switches are addressed.

For achieving an optimum efficiency, the output impedance $R_{out}$ should be chosen as low as possible. Therefore, the switching frequency should be chosen just above the "corner frequency" $f_1$ shown in FIG. 9. Increasing $f_s$ further above $f_1$ is pointless because $R_{out}$ does not decrease further. On the contrary, switching losses associated with switching the odd-numbered and even-numbered switches on and off would increase.

The switch resistance should be chosen low as well. This leads to an increased switching frequency $f_1$ for a constant capacitance. For larger threshold frequencies $f_1$, the capacitive losses in the region, where $R_{out}$ is constant could be come so large that the switching frequency has to be chosen lower than the threshold frequency to improve the efficiency. However, since the switching frequency should remain constant in most applications, e.g., due to constrains of electromagnetic compatibility (EMC), it is now possible with the trench multi-capacitor device to change the value of the capacitance of the capacitors, the DC-to-DC converter depending on the output load $R_L$. This can be achieved by a combination of the concepts shown in the embodiments of FIGS. 4 to 6, which allow selecting a desired capacitance for a capacitor of the DC-to-DC converter and the by suitable switching, and operating the resulting DC-to-DC-converter structure by switching between two multi-capacitor configurations having the selected capacitors.

The control unit thus not only operates on switches for combining different capacitor-electrode layers to form a capacitor of a desired capacitance. It also controls the operation of switches during operation of the capacitive converter. The formal functionality of the control unit can be described as adjustment functionality for achieving a best suitable converter structure, and the latter functionality can be described as controlling the operation of the converter. As an example for the first functionality, the output impedance of the converter structure in the switching frequency region below the threshold frequency $F_1$ can be lowered by increasing the pump capacitance values.

Changing the capacitance values also offers a way to control the output voltage of the converter. At the same load, $V_{out}$ can be made controllable, and for a varying load $V_{out}$ can be kept constant by adjusting the capacitance values. This is a clear advantage over capacitive converters, in which the capacitance cannot be controlled.

A further advantage of the capacitive converters, which can be realized as embodiments of the trench multi-capacitor device is that it allows providing a capacitor with a high breakdown voltage in certain multi-capacitor configurations. On the other hand, with the same processing technology, a reconfigurable capacitor can be realized that in comparison with the previously mentioned capacitor has a higher capacitance at a lower breakdown voltage by placing MIM units in parallel.

A further advantage of the DC-to-DC-converter concept described herein will be explained with reference to the following FIGS. 10 to 13.

Figure 10:
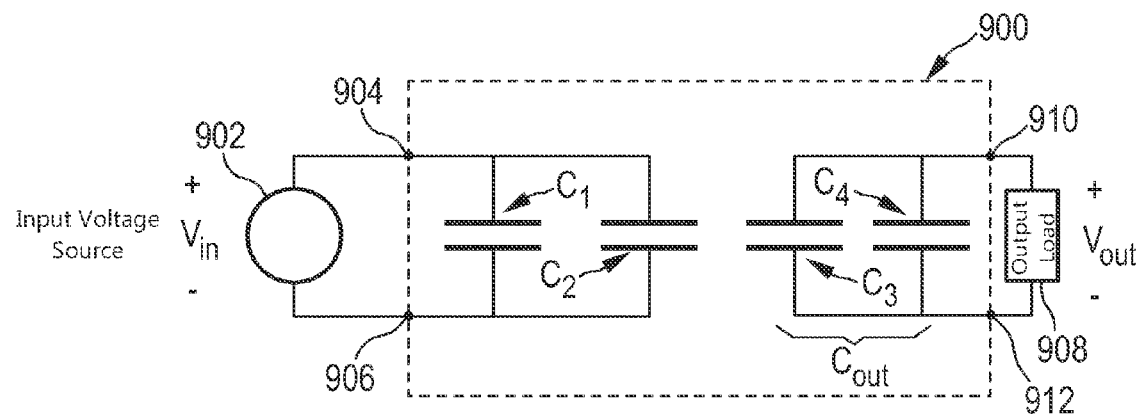
FIGS. 10 and 11 show circuit diagrams representing different operational phases of a DC-to-DC converter with a ratio of output voltage to input voltage of 2.
Figure 11:
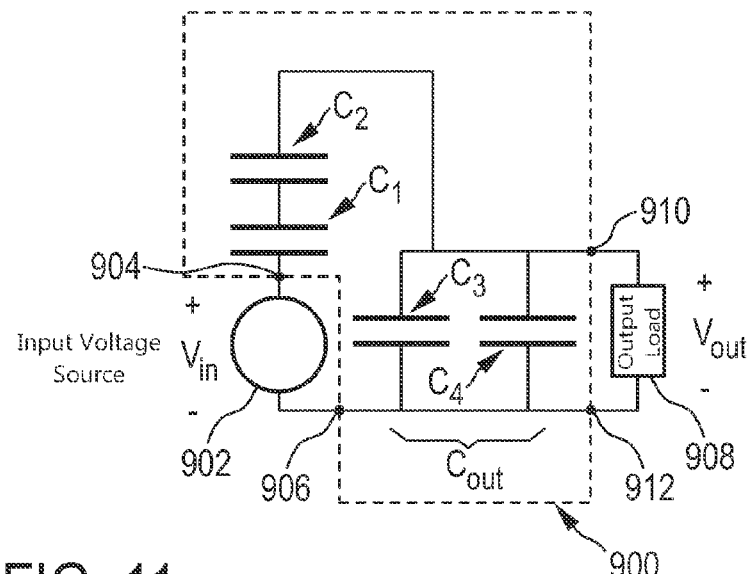
Figure 12:
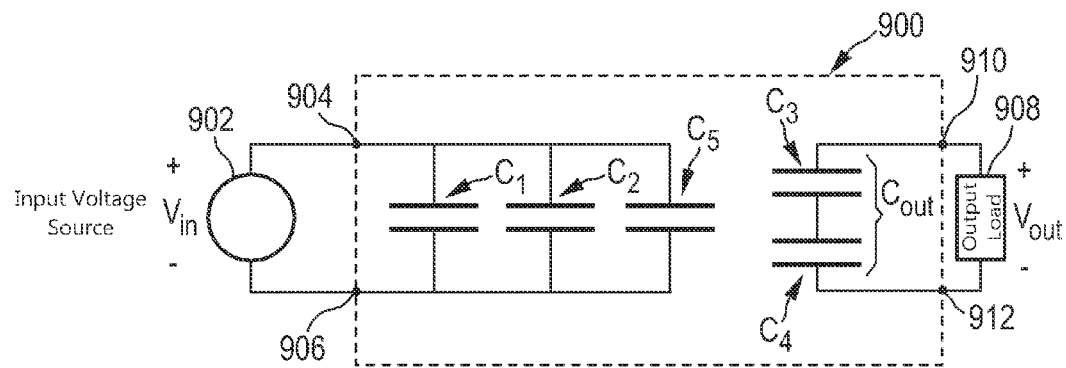
FIGS. 12 and 13 show circuit diagrams representing different operational phases of a DC-to-DC converter with a ratio of output voltage to input voltage of 4.
Figure 13:
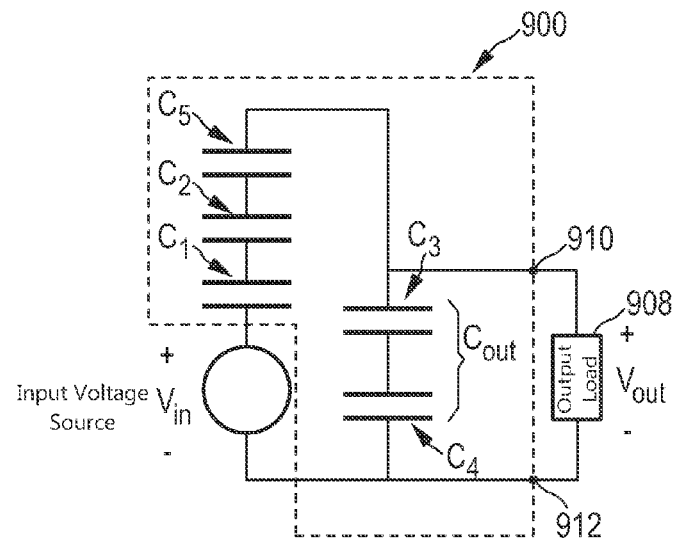

FIGS. 10 and 11 show circuit diagrams representing different operational phases of a DC-to-DC converter with a ratio of output voltage to input voltage of 2 (×2 converter). FIGS. 12 and 13 show circuit diagrams representing different operational phases of a DC-to-DC converter with a ratio of output voltage to input voltage of 4 (×4 converter). The circuit diagrams of FIGS. 10 to 13 are simplified in that the switching unit and the control unit is not represented in the figures. What is shown corresponds to the circuit diagrams effected by the switching unit and the control unit of the trench multi-capacitor device.

Turning to FIG. 10, in a first operational phase of the ×2 DC-to-DC converter 900 of FIGS. 10 and 11 an input voltage is provided by an external voltage source 902 to input terminals 904 and 906. Two capacitors C1 and C2 are arranged in a parallel configuration and decoupled from an output capacitor structure formed by a parallel connection of two capacitors C3 and C4. In a second operational phase shown in FIG. 11, the two input capacitors C1 and C2 are stacked in series on top of the parallel connection of the output capacitor structure formed by the parallel connection of the capacitors C3 and C4. This way, 2 $V_{in}$, will be provided to an output load 908 via two output terminals 910 and 912.

The following description turns to the two operational phases of a ×4 DC-to-DC converter illustrated in the circuit diagrams of FIGS. 12 and 13. The times 4 DC-to-DC converter of FIG. 12 is realized with the same trench multi-capacitor device use for the ×2 DC-to-DC converter of FIGS. 10 and 11. The multi-capacitor configurations shown in FIGS. 12 and 13 are effected by controlled switching performed by the switching unit and the control unit, which, as mentioned, are not shown in this graphical representation. The multi-capacitor configuration for the first operational phase of the ×4 converter realized with the trench multi-capacitor device 900 has the two capacitors C1 and C2 connected in parallel with a fifth capacitor C5. In a second multi-capacitor configuration of the same trench multi-capacitor device, the three capacitors C1, C2, and C5 are stacked in series on top of the series connection of the output capacitors C3 and C4.

In synopsis of FIGS. 10 to 13, the output capacitance $C_{out}$ of the two DC-to-DC converters, which are realized by four different multi-capacitor configurations of the trench multi-capacitor device 900 are identical. For the ×4 converter of FIGS. 12 and 13, 4 $V_{in}$ will be present across the series connection of the output capacitors C3 and C4, whereas for the ×2 converter of FIGS. 10 and 11 only 2 $V_{in}$ is present across the parallel connection of the identical capacitors C3 and C4. Therefore, the breakdown voltage should be twice as high for the ×4 converter. On the other hand, for the ×4 converter, assuming a ripple voltage of a fixed percentage of the output voltage takes twice as less capacitance as for the ×2 converter. Therefore, the output capacitance $C_{out}$ can be formed by placing two unit capacitors C3 and C4 in series, whereas it can be formed for the ×2 converter by placing the same two unit capacitors C3 and C4 in parallel, achieving, in comparison with the ×4 converter, twice the output capacitance at half the breakdown voltage. It is thus possible to use the same capacitive entities for the output capacitance of different DC-to-DC converters having different conversion ratios, which forms an advantage regarding the simplicity of the control and switching units.

In summary, the previous description of embodiments shows that the trench multi-capacitor device of the present invention allows optimizing the efficiency of DC-to-DC converters integrated into an IC technology framework. This is due to the possibility to realize high capacitance values in a relatively small area. Furthermore, floating capacitors with a very low parasitic capacitance to ground can be realized. The output voltage of a capacitive DC-to-DC converter can be controlled at a fixed switching frequency by changing the capacitance value as a function of the load current. Finally, the multi-capacitor configurations can be adapted to mutually diverging requirements of breakdown voltage and capacitance value in different multi capacitor-configurations.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. The trench multi-capacitor device can comprise several trenches. More specifically, some electrode layers of the trench filling in the semiconductor substrate can for instance be coupled with different capacitive structures in another trench or with a different stand-alone capacitor on the same or on a different semiconductor substrate, in order to increase the total capacitance or number of available multi-capacitor configurations.

In the claims, the word "comprising" does not exclude other elements or steps, and the indefinite article "a" or "an" does not exclude a plurality. A single unit may fulfill the functions of several items recited in the claims, such as the switching unit and the control unit. The mere fact that certain measures are recited in mutually different dependent claims does not indicate that a combination of these measured cannot be used to advantage.

Any reference signs in the claims should not be construed as limiting the scope.

The invention claimed is:

1. A DC-to-DC converter, comprising
   a reconfigurable capacitor unit provided with a substrate and comprising a plurality of capacitive structures each comprising a first and a second electrically conductive capacitor-electrode layer and an intermediate dielectric layer;
   a switching unit that comprises a plurality of switching elements electrically interconnected between different capacitive structures, wherein the individual switching elements are configured to electrically connect, in a first switching state, two respective capacitor-electrode layers with each other, and to electrically disconnect, in a second switching state, the same two respective capacitor-electrode layers from each other, the switching elements having a control input terminal and being configured to assume either the first or the second switching state in dependence on a switch-control signal applied to the control input terminal; and
   a control unit, which is connected with the switching unit and which is configured to generate and provide to the switching unit respective control signals for forming a respective one of a plurality of multi-capacitor configurations using the capacitive structures,
   wherein at least a first capacitive structure is defined in a trench in the substrate to define a trench filling, wherein a second capacitive structure is defined in the same trench in the substrate as the first capacitive structure, to form part of the same trench filling.

2. A system-in-package, comprising a converter according to claim 1, wherein at least one of the switching unit and the control unit is defined on a different substrate than the reconfigurable capacitor unit.

3. The converter as claimed in claim 1, wherein at least a portion of the switching elements of the switching unit are monolithically integrated with the reconfigurable capacitor unit.

4. The converter as claimed in claim 1, wherein the capacitor-electrode layers are connected with a respective one of at least two internal capacitor terminals.

5. The converter of claim 1, wherein the trench filling includes at least five capacitor-electrode layers, and wherein the control unit is configured to generate control signals for assuming a respective one of a plurality of multi-capacitor configurations, the respective multi-capacitor configuration connecting the capacitor-electrode layers so as to form
either a series connection of capacitors,
or a parallel connection of capacitors,
or a series connection of a first number of capacitors and a parallel connection of a second number of capacitors.

6. The converter of claim 1, comprising
input terminals configured for application of a DC input voltage from an external voltage source to the trench multi-capacitor device;
output terminals configured for providing a DC output voltage from the trench multi-capacitor device to an external load;
wherein the switching unit is configured to form a first multi-capacitor configuration with at least two capacitors connected between the input terminals, and a second multi-capacitor configuration that comprises at least one output capacitor internally connected between the output terminals; and wherein
the control unit is configured to generate and provide control signals to the switching unit for periodically switching between the first and second multi-capacitor configurations with a switching frequency.

7. The converter of claim 6, wherein
the control unit is configured to adjust the switching frequency to a switching-frequency value that minimizes an output impedance of the DC-to-DC converter and at the same time represents a minimum switching-frequency value in a set of switching-frequency values, which minimize the output impedance of the DC-to-DC converter.

8. The converter of claim 6, wherein
the control unit has a load-sensor input for receiving information indicative of a given external-load impedance connected between the output terminals, and wherein
the control unit is configured to generate and provide control signals instructing the switching unit to change from a third multi-capacitor configuration, with which, at the given external-load impedance, the DC-to-DC converter exhibits a higher output impedance, to a different, fourth multi-capacitor configuration, with which, at the given external-load impedance, the DC-to-DC converter exhibits a lower output impedance.

9. The converter of claim 6, wherein
the control unit has a load-sensor input for receiving information indicative of a given external-load impedance connected between the output terminals, and wherein
the control unit is configured to generate and provide control signals instructing the switching unit to assume, upon detecting a change of the external-load impedance from a first value to a second value, a fifth multi-capacitor configuration, which minimizes a difference between the respective output voltages of the DC-to-DC converter at the first and second value of the external-load impedance.

10. The converter of claim 6, wherein
the control unit is configured to generate and provide control signals instructing the switching unit to connect the capacitor-electrode layers according to one of at least two different multi-capacitor-configurations forming DC-to-DC converters with different conversion ratios of input voltage and output voltage.

11. The converter of claim 10, wherein
the control unit is configured to generate and provide control signals instructing the switching unit to use identical output capacitors in any of the at least two different DC-DC-converter configurations.

12. The converter of claim 1, which is configured for operation as a resonant DC-to-DC converter.

13. The converter of claim 1, comprising
input terminals configured for application of a DC input voltage from an external voltage source to the reconfigurable capacitor unit;
output terminals configured for providing a DC output voltage from the reconfigurable capacitor unit to an external load;
an LC tank comprising at least one inductor and at least one capacitor; wherein
the switching unit is configured to switch between a connection of the LC tank with either the input terminals or the output terminals at a switching frequency;
wherein the switching unit is configured to connect the capacitor-electrode layers of the trench filling so as to respectively form one of at least two alternative multi-capacitor configurations, which form a part of the LC tank;
the control unit has a load-sensor input for receiving information indicative of a given external-load impedance connected between the output terminals; and wherein
the control unit is configured to generate and provide control signals instructing the switching unit to operate, in dependence on the detected external load-impedance, with a respective switching-frequency value and a respective multi-capacitor configuration.

14. The converter of claim 1, wherein the substrate further comprises a through-substrate via extending from a first substrate side to an opposite second substrate side, and wherein the trench and the through-substrate via are formed in a respective trench opening and a via opening in the semiconductor substrate, which trench opening and via opening have mutually equal lateral extensions.

15. A DC-to-DC converter, comprising
a reconfigurable capacitor unit provided with a substrate and comprising a plurality of capacitive structures each comprising a first and a second electrically conductive capacitor-electrode layer and an intermediate dielectric layer;
a switching unit that comprises a plurality of switching elements electrically interconnected between different capacitive structures, wherein the individual switching elements are configured to electrically connect, in a first switching state, two respective capacitor-electrode layers with each other, and to electrically disconnect, in a second switching state, the same two respective capacitor-electrode layers from each other, the switching elements having a control input terminal and being configured to assume either the first or the second switching state in dependence on a switch-control signal applied to the control input terminal; and
a control unit, which is connected with the switching unit and which is configured to generate and provide to the switching unit respective control signals for forming a respective one of a plurality of multi-capacitor configurations using the capacitive structures, wherein at least a first capacitive structure is defined in a trench in the substrate to define a trench filling, wherein the trench filling includes at least five capacitor-electrode layers, and wherein the control unit is configured to generate control signals for assuming a respective one of a plurality of multi-capacitor configurations, the respective multi-capacitor configuration connecting the capacitor-electrode layers so as to form
either a series connection of capacitors,
or a parallel connection of capacitors,
or a series connection of a first number of capacitors and a parallel connection of a second number of capacitors.

16. A DC-to-DC converter, comprising
a reconfigurable capacitor unit provided with a substrate and comprising a plurality of capacitive structures each comprising a first and a second electrically conductive capacitor-electrode layer and an intermediate dielectric layer;
a switching unit that comprises a plurality of switching elements electrically interconnected between different capacitive structures, wherein the individual switching elements are configured to electrically connect, in a first switching state, two respective capacitor-electrode layers with each other, and to electrically disconnect, in a second switching state, the same two respective capacitor-electrode layers from each other, the switching elements having a control input terminal and being configured to assume either the first or the second switching state in dependence on a switch-control signal applied to the control input terminal; and
a control unit, which is connected with the switching unit and which is configured to generate and provide to the switching unit respective control signals for forming a respective one of a plurality of multi-capacitor configurations using the capacitive structures,
wherein the substrate comprises a trench and a through-substrate via extending from a first substrate side to an opposite second substrate side, and wherein the trench and the through-substrate via are formed in a respective trench opening and a via opening in the semiconductor substrate, which trench opening and via opening have mutually equal lateral extensions.

17. The converter of claim 16, wherein the capacitor-electrode layers are connected with a respective one of at least two internal capacitor terminals.

\* \* \* \* \*